(12) United States Patent
Van Zeijl et al.

(10) Patent No.: US 8,154,357 B2
(45) Date of Patent: Apr. 10, 2012

(54) MODULATION FOR AMPLITUDE-MODULATING A SIGNAL

(75) Inventors: Paulus Van Zeijl, Veldhoven (NL); Manel Collados Asensio, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 330 days.

(21) Appl. No.: 12/297,961

(22) PCT Filed: Apr. 19, 2007

(86) PCT No.: PCT/IB2007/051411
§ 371 (c)(1),
(2), (4) Date: Feb. 23, 2009

(87) PCT Pub. No.: WO2007/122562
PCT Pub. Date: Nov. 1, 2007

(65) Prior Publication Data
US 2010/0052806 A1 Mar. 4, 2010

(30) Foreign Application Priority Data
Apr. 21, 2006 (EP) .................................. 06112906

(51) Int. Cl.
*H03C 1/36* (2006.01)
*H03F 3/16* (2006.01)
*H04L 27/04* (2006.01)
*H04L 27/20* (2006.01)

(52) U.S. Cl. ........ 332/105; 332/145; 332/146; 332/152; 332/178; 330/10; 330/277; 375/300; 455/102; 455/108

(58) Field of Classification Search .................... 330/10, 330/277; 332/103, 105, 144–146, 149, 151, 332/152, 178; 375/300, 320; 455/102, 108
See application file for complete search history.

(56) References Cited

U.S. PATENT DOCUMENTS

| | | | | |
|---|---|---|---|---|
| 4,095,196 A | * | 6/1978 | Seidel | 332/144 |
| 4,213,103 A | * | 7/1980 | Birt | 455/108 |
| 5,095,290 A | * | 3/1992 | Sevenhans et al. | 455/108 |

(Continued)

FOREIGN PATENT DOCUMENTS
WO  WO 2004/036737 A2  4/2004

OTHER PUBLICATIONS

Written Opinion of the International Searching Authority dated Oct. 21, 2008 in connection with PCT Patent Application No. PCT/IB2007/051411.

International Search Report from corresponding International Application No. PCT/IB2007/051411 filed Apr. 19, 2007.

*Primary Examiner* — Levi Gannon (57) ABSTRACT

Modulators for amplitude-modulating signals defined by phase information and envelope codes are provided with first transistors for receiving the phase information and second transistors for receiving the envelope codes. The first main electrode of one transistor is coupled to the second main electrode of the other transistor and the other second main electrode constitutes an output of the modulator. This modulator can be used in any kind of transistor environment and is simple and low cost. The doped areas of the coupled first and second main electrodes comprise an overlap to reduce crosstalk and to reduce silicon area. Polar transmitters are provided with this modulator and with a circuit for generating a phase/frequency code and the envelope code and with an oscillator for receiving the phase/frequency code and for generating the phase information. A phase shift between the phase information and the envelope code reduce aliases.

14 Claims, 9 Drawing Sheets

U.S. PATENT DOCUMENTS

| | | |
|---|---|---|
| 6,380,802 B1 | 4/2002 | Pehike et al. |
| 6,472,934 B1 * | 10/2002 | Pehlke .......................... 330/10 |
| 6,738,432 B2 * | 5/2004 | Pehlke et al. ................ 375/300 |
| 7,012,305 B2 * | 3/2006 | Su et al. ...................... 257/355 |
| 7,427,903 B2 * | 9/2008 | Puma ........................... 332/145 |
| 2002/0141510 A1 | 10/2002 | Sridharan et al. |
| 2003/0215026 A1 | 11/2003 | Hietala |
| 2010/0001793 A1 * | 1/2010 | Van Zeijl et al. ............. 330/10 |

* cited by examiner

(PRIOR ART)

MODULATION FOR AMPLITUDE-MODULATING A SIGNAL

CROSS-REFERENCE TO RELATED APPLICATION(S)

The present application claims priority under 35 U.S.C. §365 to International Patent Application No. PCT/IB2007/051411 filed Apr. 19, 2007, entitled "A MODULATOR FOR AMPLITUDE-MODULATING A SIGNAL". International Patent Application No. PCT/IB2007/051411 claims priority under 35 U.S.C. §365 and/or 35 U.S.C. §119(a) to European Patent Application No. 06112906.0 filed Apr. 21, 2006 and which are incorporated herein by reference into the present disclosure as if fully set forth herein.

FIELD OF THE INVENTION

The invention relates to a modulator for amplitude-modulating a signal, and also relates to a polar transmitter comprising a modulator, to a device comprising a polar transmitter, to a method for amplitude-modulating a signal, to a computer program product for performing steps of a method and to a medium comprising a computer program product.

Examples of such a device are mobile phones and wireless interfaces and other wireless consumer products and wireless non-consumer products and wired products.

BACKGROUND OF THE INVENTION

A prior art device is known from U.S. Pat. No. 6,891,432, which discloses an apparatus for electromagnetic processing. The apparatus comprises a polar transmitter in the form of a processor comprising an analog to digital converter and a rectangular to polar converter. The analog to digital converter digitizes a wave, for example by the use of rectangular coordinates or I,Q data. The rectangular to polar converter receives the I,Q data and translates this data into polar coordinates. The rectangular to polar converter generates a digitized wave in polar coordinates comprising an amplitude characteristic and a phase characteristic. The polar transmitter further comprises a modulator comprising control components such as switching transistors for receiving the amplitude characteristic and comprising transistors used as current sources that receive the phase characteristic. The switching transistors control the current sources.

The US patent further discloses that the control components form a bias network for biasing the current sources and discloses that the phase characteristic drives the current sources. So, the current sources are driven as well as biased. This is a first indication that this prior art is based on bipolar transistor technology. Further, each current source in this US patent comprises two inputs at the left side and one output at the right side. One of these inputs is coupled to an output of a corresponding control component and the other input receives the phase characteristic and the output is coupled to the other outputs of the other current sources. So, in the US patent, the control components form a first stage and the current sources form a subsequent second stage. This is a second indication that this prior art is based on bipolar transistor technology.

The known device is disadvantageous, inter alia, owing to the fact that it is specifically designed for bipolar transistor technology.

SUMMARY OF THE INVENTION

It is an object of one embodiment the invention, inter alia, to provide a modulator that is not specifically designed for bipolar transistor technology.

Further objects of embodiments of the invention are, inter alia, to provide a polar transmitter comprising a modulator, a device comprising a polar transmitter, a method for amplitude-modulating a signal and a computer program product for performing steps of a method that are not specifically designed for bipolar transistor technology.

The modulator according to an embodiment the invention for amplitude-modulating a signal defined by phase information and an envelope code comprises a first transistor for receiving the phase information and comprising a second transistor for receiving the envelope code, which first and second transistors each comprise first and second main electrodes, the first main electrode of one of the first and second transistors being coupled to the second main electrode of the other one of the first and second transistors and the other second main electrode constituting an output of the modulator.

By providing the modulator with two transistors and by serially coupling the two main current paths of the two transistors such that the two main current paths form one longer main current path, a modulator has been created that is not specifically designed for bipolar transistor technology. The modulator according to an embodiment of the invention may be designed for bipolar transistor technology or may be designed for field effect transistor technology or may be designed for another kind of transistor technology.

The modulator according to an embodiment the invention is further advantageous, inter alia, in that it is simple and low cost.

It should be noted that U.S. Pat. No. 6,891,432 points away from the simple and low cost modulator according to the invention owing to the fact that in FIG. 1 of this US patent firstly different symbols are used for the control components (22a-g) and for the current sources (25a-g) and secondly different subsequent stages and complex wirings are used.

An embodiment of the modulator according to the invention is defined by the doped areas of the coupled first and second main electrodes comprising an overlap. By designing the integration masks such that the doped areas of the coupled first and second main electrodes are overlapping, it is no longer necessary to couple these first and second main electrodes via a metal strip. As a result, a value of a parasitic capacitance that is responsible for cross-talk is reduced and a silicon area can be reduced, which are great advantages.

An embodiment of the modulator according to the invention is defined by the second main electrode of the second transistor constituting the output. Preferably, the second transistor is located closer to the output than the first transistor, in view of the available voltage swings.

An embodiment of the modulator according to the invention is defined by comprising a further transistor that comprises a first main electrode coupled to the output and a second main electrode constituting a further output of the modulator. Such a further transistor that is connected in serial to the first and second transistors increases the reliability of the modulator owing to the fact that it reduces the voltages on the first and second transistors.

An embodiment of the modulator according to the invention is defined by the second transistor further comprising a control electrode for receiving the envelope code. By supplying the envelope code to the control electrode of the second transistor, the second transistor is given a digital switching function in a simple way.

An embodiment of the modulator according to the invention is defined by the first transistor further comprising a control electrode for receiving the phase information. By supplying the phase information to the control electrode of the first transistor, which control electrode may further be coupled to the first main electrode of this first transistor, the first transistor is given a current source function and/or a buffering function and/or an amplifying function in a simple way.

An embodiment of the modulator according to the invention is defined by the first main electrode of the first transistor receiving the phase information. By supplying the phase information to the first main electrode of the first transistor, the first transistor is given a current source function and/or a buffering function and/or an amplifying function in a simple way.

An embodiment of the modulator according to the invention is defined by comprising a further first transistor for receiving the phase information and comprising a further second transistor for receiving an inversion of the envelope code, which further first and further second transistors each comprise first and second main electrodes, the first main electrode of one of the further first and further second transistors being coupled to the second main electrode of the other one of the further first and further second transistors and the other second main electrode being coupled to the output of the modulator. This modulator is a symmetric modulator that does not require a resonance circuit or a transformer at its output for filtering DC components but that only requires a capacitor at its output for filtering DC components.

An embodiment of the modulator according to the invention is defined by comprising a third transistor for receiving the phase information and comprising a fourth transistor for receiving a further envelope code, which third and fourth transistors each comprise first and second main electrodes, the first main electrode of one of the third and fourth transistors being coupled to the second main electrode of the other one of the third and fourth transistors and the other second main electrode being coupled to the output of the modulator. This modulator has an increased number of amplitude-modulation levels.

An embodiment of the modulator according to the invention is defined by comprising a further third transistor for receiving the phase information and comprising a further fourth transistor for receiving an inversion of the further envelope code, which further third and further fourth transistors each comprise first and second main electrodes, the first main electrode of one of the further third and further fourth transistors being coupled to the second main electrode of the other one of the further third and further fourth transistors and the other second main electrode being coupled to the output of the modulator. This modulator is a symmetric modulator that has an increased number of amplitude-modulation levels.

The polar transmitter according to an embodiment the invention is defined by comprising the modulator according to the invention and comprising a circuit for generating a phase/frequency code and the envelope code and comprising an oscillator for receiving the phase/frequency code and for generating the phase information. The circuit for example comprises a digital CORDIC or an analog CORDIC and the oscillator for example comprises a voltage controlled oscillator and for example forms part of a Phase Locked Loop. In case of an analog CORDIC, the analog phase/frequency code and the analog envelope code may each need to be low pass filtered and digitized before further being used.

An embodiment of the polar transmitter according to the invention is defined by comprising means for creating a phase shift between the phase information and the envelope code. These means may for example comprise a delay line without excluding further means and may be located before the circuit for generating the phase code and the envelope code, between this circuit and the oscillator or between the oscillator and the modulator or may form part of the modulator. Such a phase shift reduces aliases.

Embodiments of the polar transmitter according to the invention and of the device according to the invention and of the method according to the invention and of the computer program product according to the invention and of the medium according to the invention correspond with the embodiments of the modulator according to the invention.

Embodiments of the invention are based upon an insight, inter alia, that designs specifically based on bipolar transistor technology are to be avoided, and is based upon a basic idea, inter alia, that a first main electrode of one of first and second transistors is to be coupled to a second main electrode of the other one of the first and second transistors and that the other second main electrode should constitute an output of the modulator.

Embodiments of the invention solve the problem, inter alia, to provide a modulator that is not specifically designed for bipolar transistor technology. The modulator according to an embodiment of the invention is further advantageous, inter alia, in that it is simple and low cost.

These and other aspects of the invention will be apparent from and elucidated with reference to the embodiments(s) described hereinafter.

BRIEF DESCRIPTION OF THE DRAWINGS

In the drawings:

FIG. 16 shows the output signal as a function of the number of branches being switched on.

DETAILED DESCRIPTION

Figure 1:
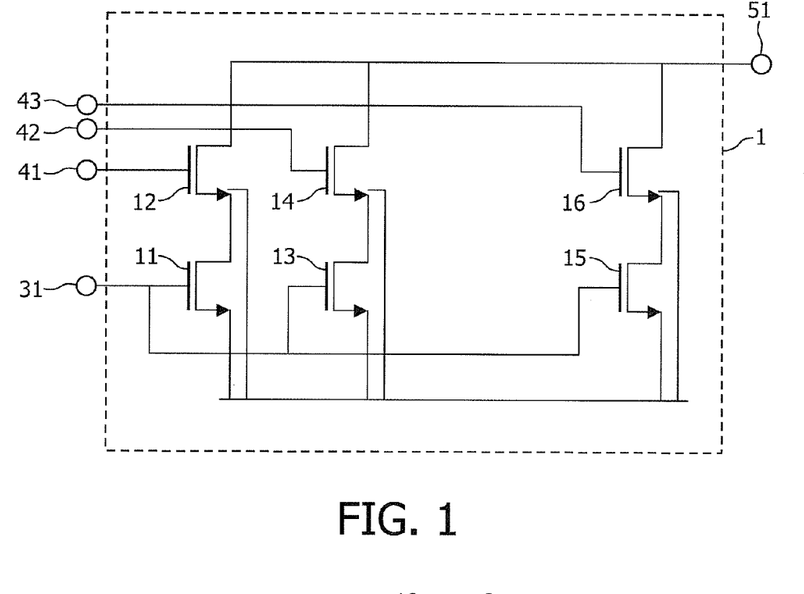
FIG. 1 shows diagrammatically a first embodiment of a modulator according to the invention.

The modulator 1 according to an embodiment of the invention shown in FIG. 1 comprises a first transistor 11 for receiving phase information and comprises a second transistor 12 for receiving an envelope code. The phase information and the envelope code define a (phase-modulated) signal that is to be amplitude-modulated by the modulator 1. The first and second transistors 11 and 12 each comprise first and second main electrodes (sources and drains). The first main electrode (source) of the second transistor 12 is coupled to the second main electrode (drain) of the first transistor 11 and the other second main electrode (drain) of the second transistor 12 constitutes and/or is coupled to an output 51 of the modulator 1. The other first main electrode (source) of the first transistor 11 is coupled to a reference terminal.

The first transistor 11 comprises a control electrode (gate) that constitutes and/or is coupled to a phase input 31 for receiving the phase information. The second transistor 12 comprises a control electrode (gate) that constitutes and/or is coupled to an envelope input 41 for receiving the envelope code.

The modulator 1 further comprises a third transistor 13 for receiving the phase information and comprises a fourth transistor 14 for receiving a further envelope code also defining the (phase-modulated) signal that is to be amplitude-modulated by the modulator 1. The third and fourth transistors 13 and 14 each comprise first and second main electrodes (sources and drains). The first main electrode (source) of the fourth transistor 14 is coupled to the second main electrode (drain) of the third transistor 13 and the other second main electrode (drain) of the fourth transistor 14 constitutes and/or is coupled to the output 51 of the modulator 1. The other first main electrode (source) of the third transistor 13 is coupled to the reference terminal.

The third transistor 13 comprises a control electrode (gate) that constitutes and/or is coupled to the phase input 31 for receiving the phase information. The fourth transistor 14 comprises a control electrode (gate) that constitutes and/or is coupled to a further envelope input 42 for receiving the further envelope code.

The modulator 1 further comprises a fifth transistor 15 for receiving the phase information and comprises a sixth transistor 16 for receiving a yet further envelope code also defining the (phase-modulated) signal that is to be amplitude-modulated by the modulator 1. The fifth and sixth transistors 15 and 16 each comprise first and second main electrodes (sources and drains). The first main electrode (source) of the sixth transistor 16 is coupled to the second main electrode (drain) of the fifth transistor 15 and the other second main electrode (drain) of the sixth transistor 16 constitutes and/or is coupled to the output 51 of the modulator 1. The other first main electrode (source) of the fifth transistor 15 is coupled to the reference terminal.

The fifth transistor 15 comprises a control electrode (gate) that constitutes and/or is coupled to the phase input 31 for receiving the phase information. The sixth transistor 16 comprises a control electrode (gate) that constitutes and/or is coupled to a yet further envelope input 43 for receiving the yet further envelope code.

The backgates of the second and fourth and sixth transistors 12 and 14 and 16 are for example coupled to the reference terminal. Alternatively, the backgates of the first and third and fifth transistors 11 and 13 and 15 may be used for receiving the phase information. Further alternatively, the first main electrodes of the first and third and fifth transistors 11 and 13 and 15 may be used for receiving the phase information etc.

In case the second, fourth and sixth transistors 12 and 14 and 16 have identical proportions, the modulator 1 functions as follows. In case the envelope of the phase-modulated signal that is to be amplitude-modulated has an amplitude "1", for example only the first transistor 11 is to be activated and is to be brought into a conducting state, via the envelope codes. In case the envelope of the phase-modulated signal that is to be amplitude-modulated has an amplitude "2", for example only the first transistor 11 and the third transistor 13 are to be activated and are to be brought into a conducting state, via the envelope codes. In case the envelope of the phase-modulated signal that is to be amplitude-modulated has an amplitude "3", for example the first transistor 11 and the third transistor 13 and the fifth transistor 15 are to be activated and are to be brought into a conducting state, via the envelope codes etc.

In case the second, fourth and sixth transistors 12 and 14 and 16 have non-identical proportions for example such that the second transistor 12 has a weighting factor "1" and the fourth transistor 14 has a weighting factor "2" and the sixth transistor 16 has a weighting factor "4", the modulator 1 functions as follows. In case the envelope of the phase-modulated signal that is to be amplitude-modulated has an amplitude "1", for example only the first transistor 11 is to be activated and is to be brought into a conducting state, via the envelope codes. In case the envelope of the phase-modulated signal that is to be amplitude-modulated has an amplitude "2", for example only the third transistor 13 is to be activated and is to be brought into a conducting state, via the envelope codes. In case the envelope of the phase-modulated signal that is to be amplitude-modulated has an amplitude "3", for example the first transistor 11 and the third transistor 13 are to be activated and are to be brought into a conducting state, via the envelope codes etc.

This way the phase-modulated signal is amplitude-modulated. The phase-modulated signal originates from an oscillator as shown in FIG. 2.

Many alternatives are possible, such as more branches or less branches coupled in parallel to each other and each branch comprising two serially coupled transistors. Further, per branch the two transistors may trade places etc. However, preferably, the transistors that receive the envelope codes are located closer to the output than the other transistors that receive the phase information, in view of the available voltage swings.

Figure 2:
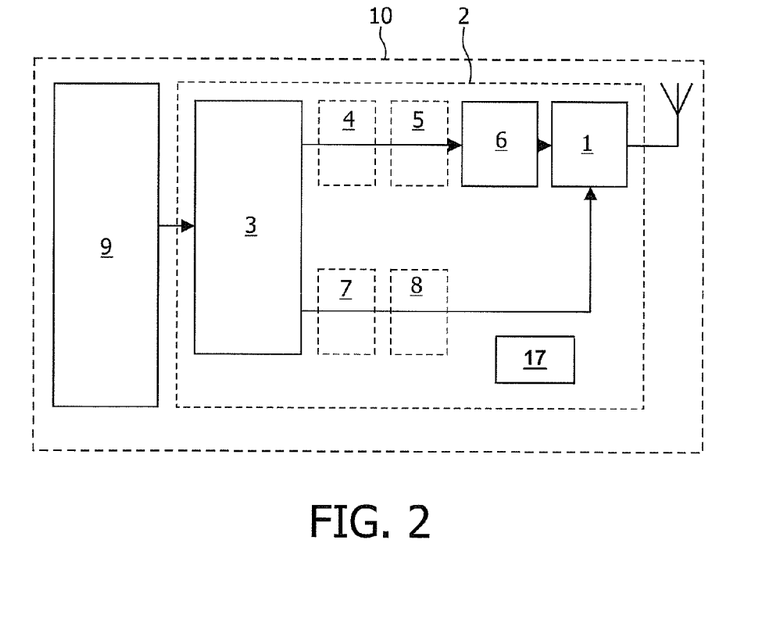
FIG. 2 shows diagrammatically a device according to the invention comprising a polar transmitter according to the invention.

The device 10 according to the invention shown in FIG. 2 comprises a polar transmitter 2 according to the invention and comprises an interfacing and processing circuit 9. The polar transmitter 2 comprises a digital circuit 3 such as a digital CORDIC for receiving for example analog in-phase and analog quadrature information from the interfacing and processing circuit 9 and for generating a digital phase/frequency code (a digital phase/frequency code comprises a digital phase code and/or a digital frequency code) and the digital envelope codes and comprises an oscillator 6 (that for example forms part of a Phase Locked Loop) for receiving the digital phase/frequency code and for generating the phase information. The modulator 1 receives this phase information and the digital envelope codes. In case of the circuit 3 being an analog circuit 3 such as an analog CORDIC, it generates an analog phase/frequency code (an analog phase/frequency code comprises an analog phase code and/or an analog frequency code) and analog envelope codes that need to be low pass filtered by low pass filters 4 and 7 and that need to be digitized by analog to digital converters 5 and 8. The output of the modulator 1 is, for example, coupled to an antenna possibly via one or more further components.

Preferably, the polar transmitter 2 further comprises means 17 such as a delay line for somewhere in the polar transmitter 2 creating a phase shift between the phase information and the envelope codes. Such a phase shift reduces aliases.

Many alternatives are possible, such as generating envelope information at the circuit 3 and then converting the envelope information into individual envelope codes that are destined for the individual transistors etc.

Figure 3:
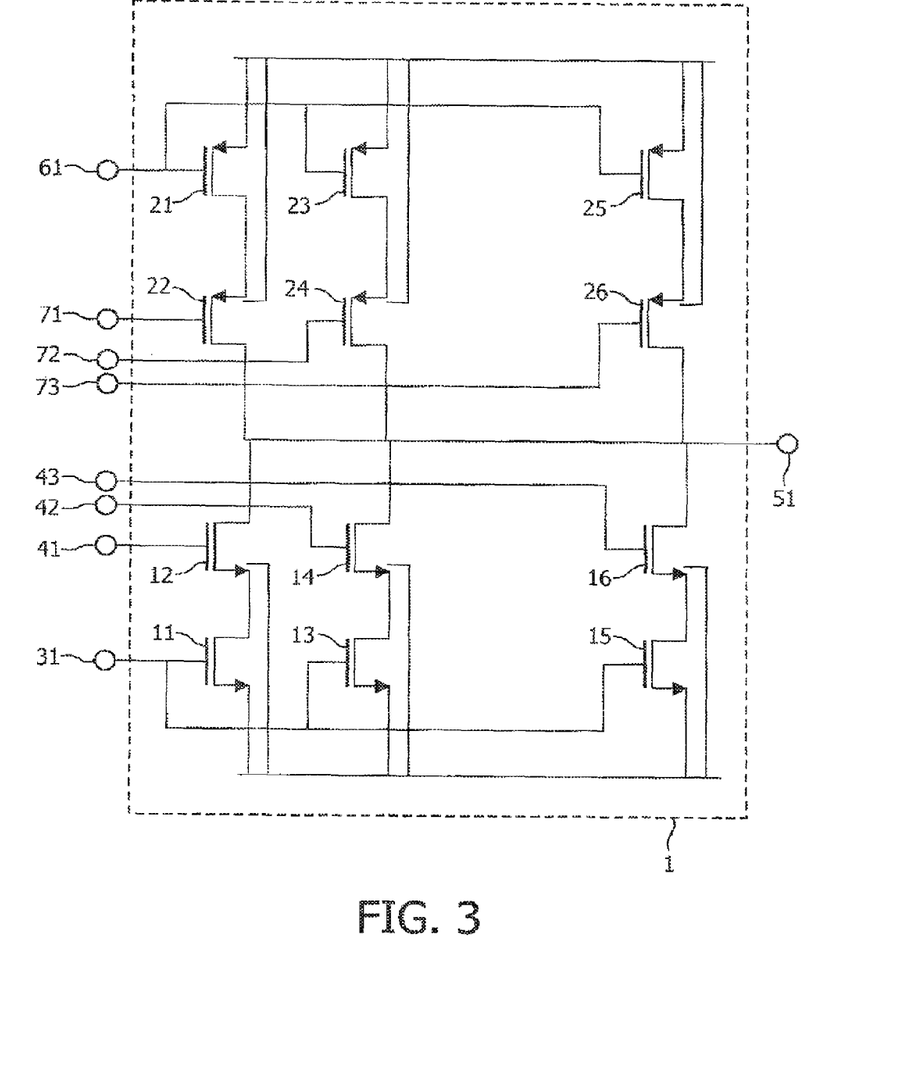
FIG. 3 shows diagrammatically a second embodiment of a modulator according to the invention.

The modulator 1 according to the invention shown in FIG. 3 corresponds with the one shown in FIG. 1 apart from the fact that each branch has been extended with two further transistors. The first branch further comprises a further first transistor 21 for receiving the phase information and comprises a further second transistor 22 for receiving an inversion of the envelope code. The further first and further second transistors 21 and 22 each comprise first and second main electrodes (sources and drains). The first main electrode (source) of the further second transistor 22 is coupled to the second main electrode (drain) of the further first transistor 21 and the other second main electrode (drain) of the further second transistor 22 constitutes and/or is coupled to the output 51 of the modulator 1. The first main electrode (source) of the further first transistor 21 is coupled to a further reference terminal.

The further first transistor 21 comprises a control electrode (gate) that constitutes and/or is coupled to a phase input 61 for receiving the phase information (so the phase inputs 31 and 61 are coupled to each other and/or receive the same phase information). The further second transistor 22 comprises a control electrode (gate) that constitutes and/or is coupled to an inverted envelope input 71 for receiving an inversion of the envelope code.

The second and third branches have been extended with further third and further fourth and further fifth and further sixth transistors 23 and 24 and 25 and 26 etc. This modulator 1 as shown in FIG. 3 is a symmetric modulator that does not require a resonance circuit or a transformer at its output for filtering DC components but that only requires a capacitor at its output for filtering DC components.

The backgates of the second and fourth and sixth transistors 12 and 14 and 16 are, for example, coupled to the reference terminal. The backgates of the further second and further fourth and further sixth transistors 22 and 24 and 26 are, for example, coupled to the further reference terminal. Alternatively, the backgates of the first and third and fifth transistors 11 and 13 and 15 and of the further first and further third and further fifth transistors 21 and 23 and 25 may be used for receiving the phase information. Further alternatively, the first main electrodes of the first and third and fifth transistors 11 and 13 and 15 may be used for receiving the phase information etc.

Figure 4:
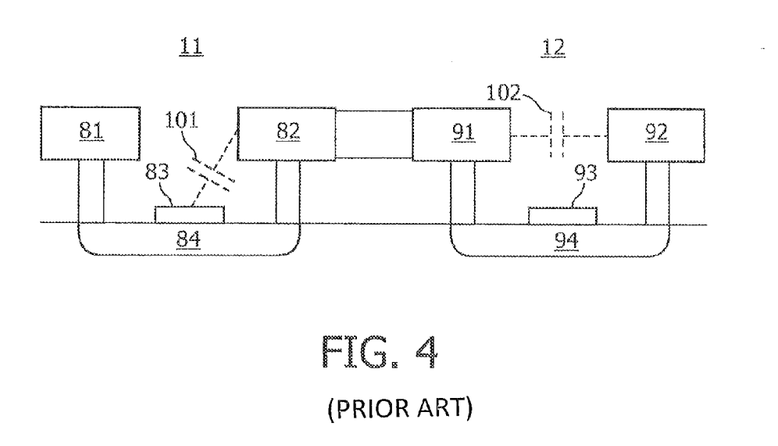
FIG. 4 shows a prior art transistor layout.

The prior art transistor layout shown in FIG. 4 discloses a metal layer with the source 81 and the drain 82 of the first transistor 11 and with the source 91 and the drain 92 of the second transistor 12 and discloses a silicon layer with the gate 83 of the first transistor 11 and with the gate 93 of the second transistor 12 located on this silicon layer and with a doped area 84 of the first transistor 11 and a doped area 94 of the second transistor 12 located in this silicon layer. In this case the drain 82 and the source 91 are coupled to each other via a metal coupling and a capacitance 101 is present between the drain 82 and the gate 83 and a capacitance 102 is present between the source 91 and the drain 92. These two capacitances 101 and 102 are responsible for relatively much cross-talk.

Figure 5:
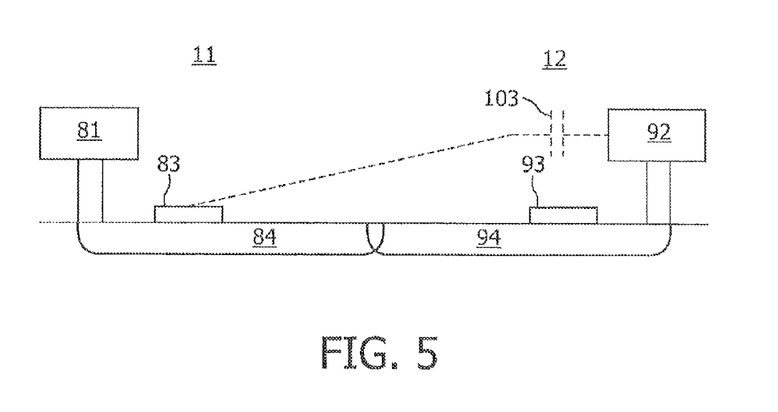
FIG. 5 shows a transistor layout according to the invention.

The transistor layout according to the invention shown in FIG. 5 has overlapping doped areas 84 and 94 of the first and second transistors 11 and 12 with respect to the drain 82 and the source 91. In this case, the drain 82 and the source 91 no longer need to be coupled to each other via a metal coupling and a capacitance 103 is now present between the gate 83 and the drain 92, which capacitance 103 is smaller than the combination of the capacitances 101 and 102. As a result, the cross-talk has been reduced and the silicon area can be reduced. To realize this, the integration masks need to be designed such that the doped areas of the coupled first and second main electrodes are overlapping.

Figure 6:
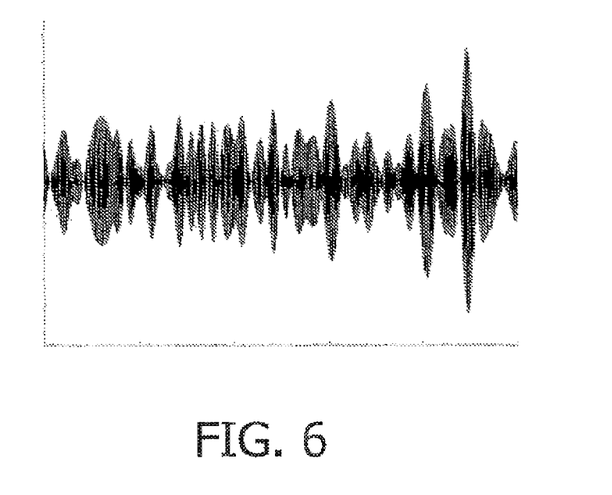
FIG. 6 shows an OFDM signal in a time domain.

In FIG. 6, an OFDM signal is shown in a time domain (y-axis −4 to +4 Volt, x-axis 0 to 1000 nsec).

Figure 7:
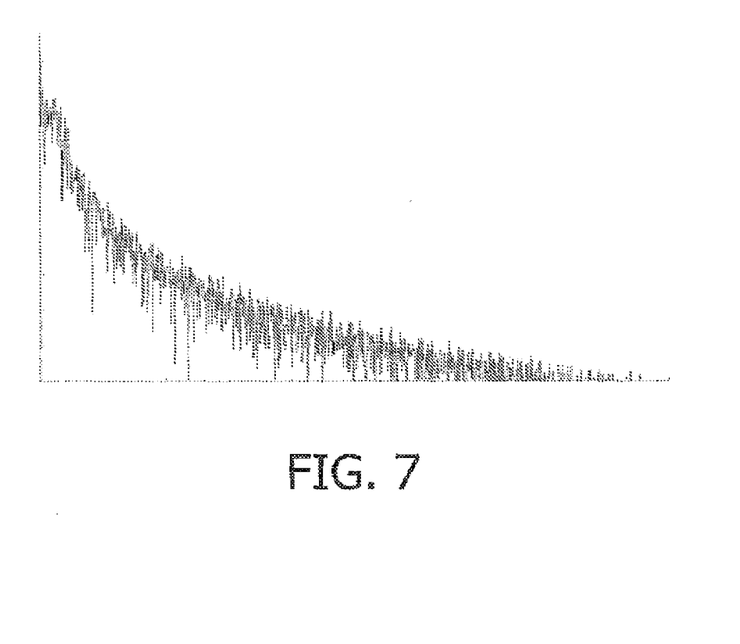
FIG. 7 shows an envelope of the OFDM signal in a frequency domain.

In FIG. 7, an envelope of the OFDM signal is shown in a frequency domain (y-axis −100 to 0 dB, x-axis 0 to 1000 MHz).

Figure 8:
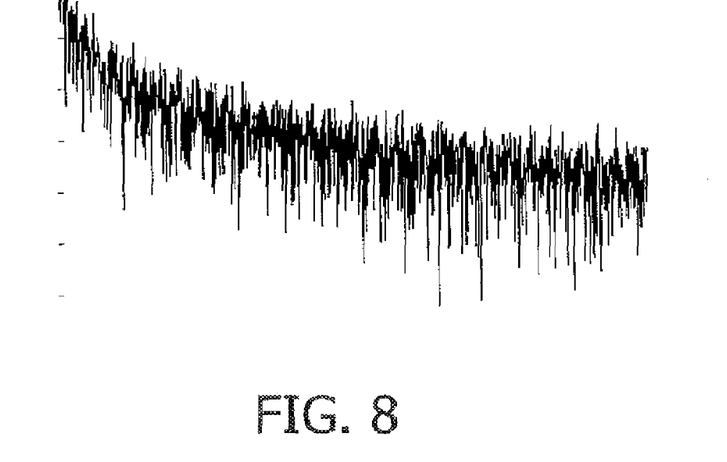
FIG. 8 shows a phase of the OFDM signal in a frequency domain.

In FIG. 8, a phase of the OFDM signal is shown in a frequency domain (y-axis −80 to 0 dB, x-axis 0 to 450 MHz).

Figure 9:
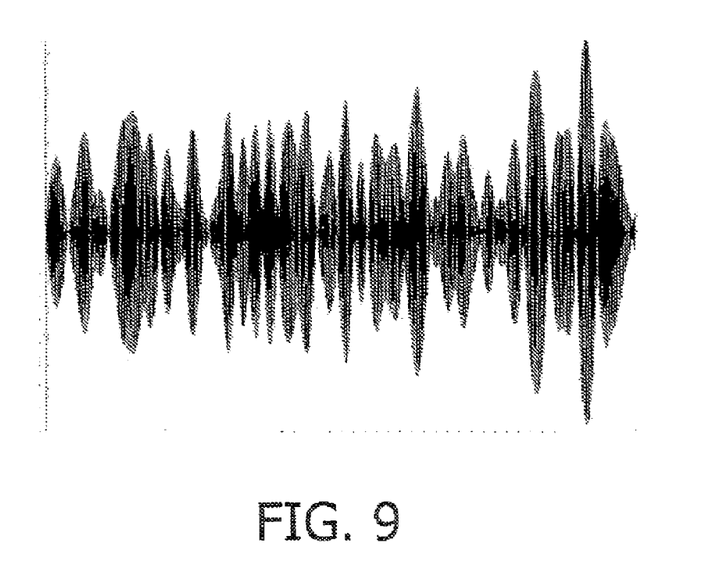
FIG. 9 shows an output signal in a time domain of the modulator according to the invention as shown in FIG. 1.

In FIG. 9, an output signal is shown in a time domain of the modulator according to the invention as shown in FIG. 1 (y-axis −900 to +900 mVolt, x-axis 0 to 1000 nsec).

Figure 10:
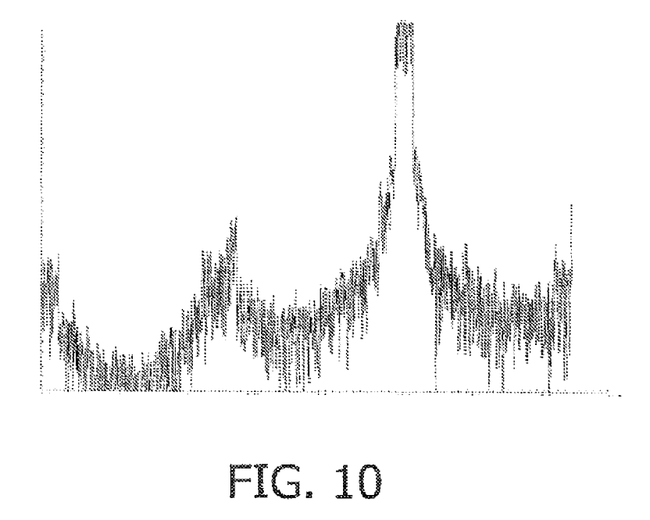
FIG. 10 shows the output signal in a frequency domain.

In FIG. 10, the output signal is shown in a frequency domain (y-axis −100 to −20 dB, x-axis 0 to 1600 MHz).

Figure 11:
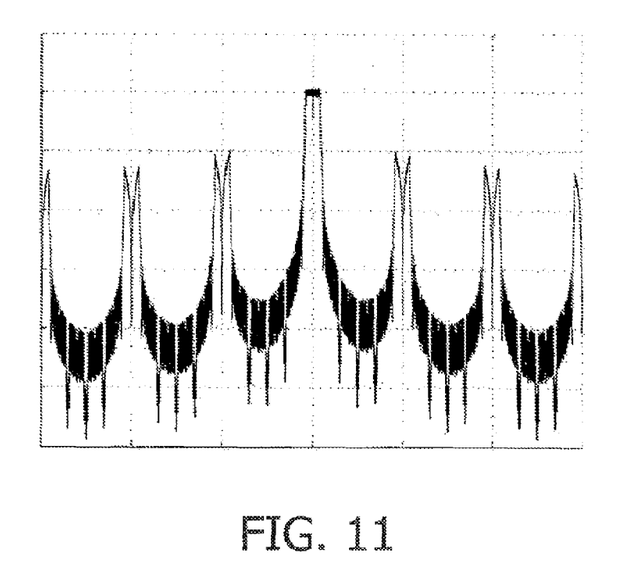
FIG. 11 shows the output signal with aligned phase and amplitude sample moments in a frequency domain.

In FIG. 11, the output signal is shown with aligned phase and amplitude sample moments in a frequency domain (y-axis −140 to 0 dB, x-axis −300 to +300 MHz relative to the center frequency).

Figure 12:
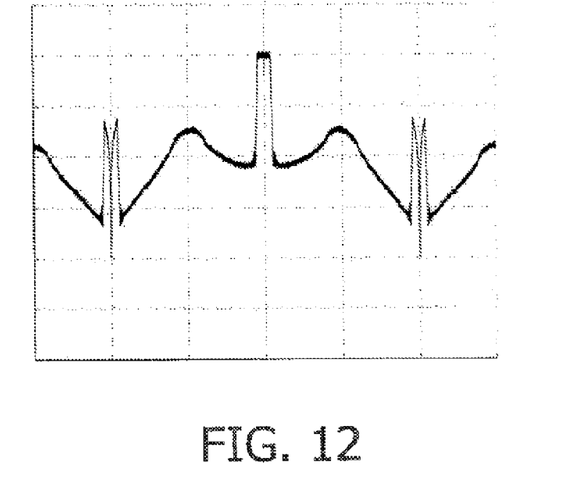
FIG. 12 shows the output signal with shifted sample moments in a frequency domain.

In FIG. 12, the output signal is shown with shifted sample moments in a frequency domain (y-axis −140 to 0 dB, x-axis −300 to +300 MHz relative to the center frequency).

Figure 13:
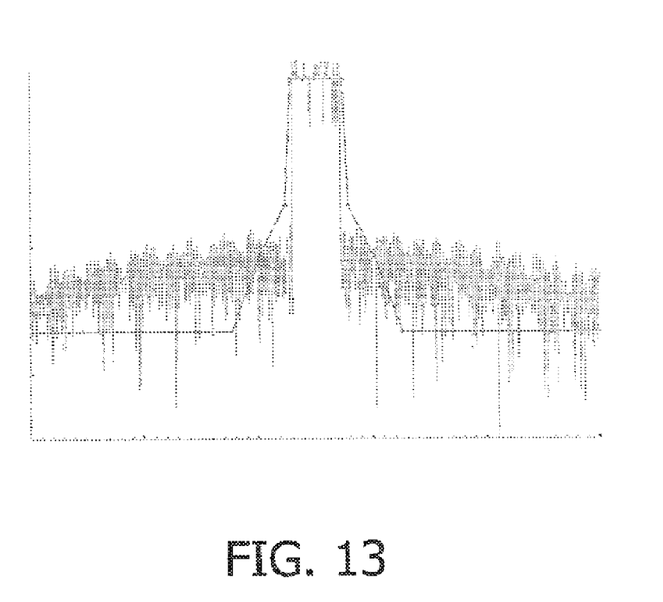
FIG. 13 shows simulation results for low pass filters between an analog CORDIC and an oscillator at a cut-off frequency of 150 MHz.

In FIG. 13, simulation results are shown for low pass filters 4 and 7 between an analog CORDIC and an oscillator at a cut-off frequency of 150 MHz (y-axis −80 to −20 dB, x-axis 220 to 420 MHz).

Figure 14:
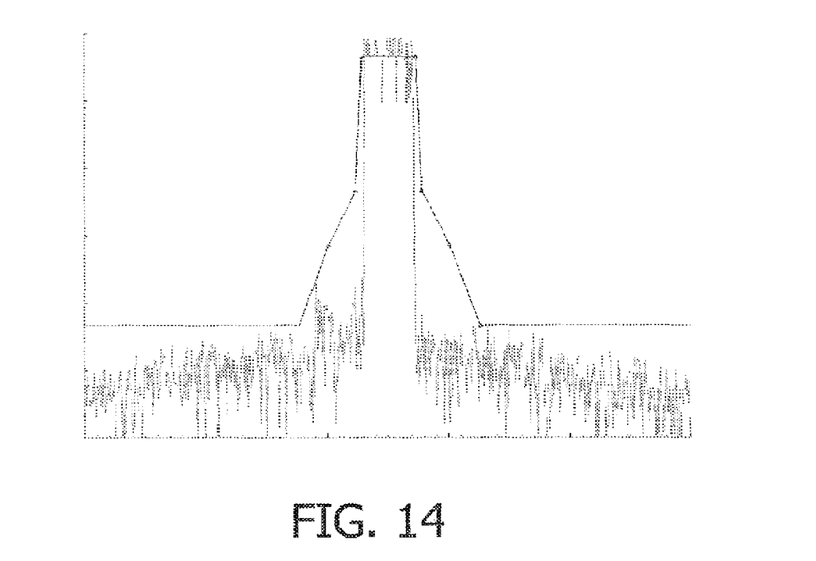
FIG. 14 shows simulation results for low pass filters between an analog CORDIC and an oscillator at an infinite cut-off frequency.

In FIG. 14, simulation results are shown for low pass filters 4 and 7 between an analog CORDIC and an oscillator at an infinite cut-off frequency (y-axis −80 to −20 dB, x-axis 220 to 420 MHz).

Figure 15:
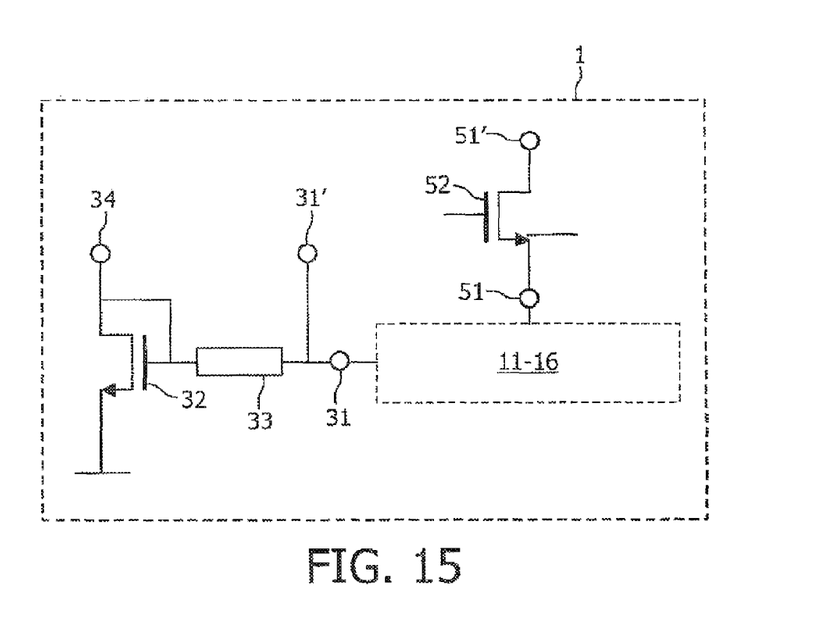
FIG. 15 shows diagrammatically a third embodiment of a modulator according to the invention for improving the first embodiment.

The modulator 1 shown in FIG. 15 comprises the transistors 11-16 already shown in FIG. 1 and indicated in FIG. 15 by the block 11-16. The modulator 1 further comprises a transistor 32 with a gate coupled via a resistor 33 to the phase input 31 and with a source coupled to the reference terminal and with a drain coupled to a bias input 34. The transistor 32 makes a power control possible. When the amplitude of the phase-modulated signal is lowered the overall output current of the circuit is lowered also. The transistor 32 defines the current flowing through all the other transistors. When the amplitude of the phase-modulated signal at the input is lowered, the bias current at the bias input 34 can be lowered correspondingly to increase the efficiency. A further phase input 31' corresponding with the phase input 31 might then be used for receiving the phase information.

The modulator 1 further comprises a further transistor 52 with a source coupled to the output 51 and with a drain coupled to a further output 51' and with a gate for receiving a possible attenuated output voltage of the output signal and with a backgate coupled to its source. The further transistor 52 increases the reliability and/or reduces reliability problems. The way it works is that the output signal is divided over the series connection of the further transistor 52 and the other transistors 11-16. In this way each branch only gets half the voltage, which leads to a much higher reliability. In order to prevent breakdown of the gate-to-backgate voltage, the backgate of the further transistor 52 may be connected to its source. This can be done using a triple-well technology. This triple-well technology has become available in modern CMOS090 and CMOS065 processes.

Figure 16:
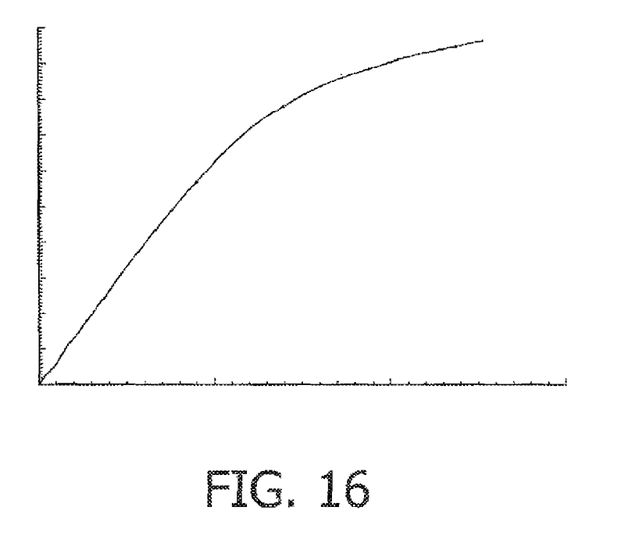

In FIG. 16 the output signal as a function of the number of branches that are switched on is shown (y-axis Volt, x-axis number). With the number of switches for example being 0-255, the output signal starts to deviate from a linear transfer curve for large input codes. By measuring the output signal and using a conversion table before driving the transistors with the envelope codes, a more linear output signal can be obtained. Thereto, a converter such as a table etc. is to be introduced for converting non-compensated envelope codes into compensated envelope codes.

Each transistor in general and each one of the (further) first and (further) third and (further) fifth transistors more in particular may be realized by a combination of two or more transistors, such as a serial construction or a parallel construction or a mixed serial parallel construction. Further, the fact that two electrodes are coupled to each other does not exclude that the two electrodes are coupled to each other via one or more active or passive elements. For example, in case the two electrodes do not have overlapping doped areas, they might need to be coupled via a passive coupling that may have a parasitic resistance, capacitance and/or inductance. The two electrodes might also be coupled via an active element such as a yet further transistor, for example for further switching purposes or adaptation purposes or security purposes etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A modulator for amplitude-modulating a signal defined by phase information and an envelope code, comprising:
   a first transistor for receiving the phase information;
   a second transistor for receiving the envelope code, wherein the first and second transistors each comprise first and second main electrodes, the first main electrode of one of the first and second transistors being coupled to the second main electrode of the other one of the first and second transistors and the other second main electrode constituting an output of the modulator;
   a further first transistor for receiving an inverse phase information of the phase information; and
   a further second transistor for receiving an inverse envelope code of the envelope code, wherein the further first and further second transistors each comprise first and second main electrodes, the first main electrode of one of the further first and further second transistors being coupled to the second main electrode of the other one of the further first and further second transistors and the other second main electrode being coupled to the output of the modulator.

2. The modulator as defined in claim 1, whereby the coupled first and second main electrodes comprise doped areas, said doped areas having overlap.

3. The modulator as defined in claim 1, the second main electrode of the second transistor constituting the output.

4. The modulator as defined in claim 1, comprising a further transistor that comprises a first main electrode coupled to the output and a second main electrode constituting a further output of the modulator.

5. The modulator as defined in claim 1, the second transistor further comprising a control electrode for receiving the envelope code.

6. The modulator as defined in claim 5, the first transistor further comprising a control electrode for receiving the phase information.

7. The modulator as defined in claim 5, the first main electrode of the first transistor receiving the phase information.

8. The modulator as defined in claim 1, comprising a third transistor for receiving the phase information and comprising a fourth transistor for receiving a further envelope code, which third and fourth transistors each comprise first and second main electrodes, the first main electrode of one of the third and fourth transistors being coupled to the second main electrode of the other one of the third and fourth transistors and the other second main electrode being coupled to the output of the modulator.

9. The modulator as defined in claim 1 comprising a further third transistor for receiving the phase information and comprising a further fourth transistor for receiving an inversion of the further envelope code, which further third and further fourth transistors each comprise first and second main electrodes, the first main electrode of one of the further third and further fourth transistors being coupled to the second main electrode of the other one of the further third and further fourth transistors and the other second main electrode being coupled to the output of the modulator.

10. A polar transmitter comprising the modulator as defined in claim 1 and comprising a circuit for generating a phase/frequency code and the envelope code and comprising an oscillator for receiving the phase/frequency code and for generating the phase information.

11. The polar transmitter as defined in claim 10 and comprising means for creating a phase shift between the phase information and the envelope code.

12. A device comprising the polar transmitter as defined in claim 10.

13. A method comprising the steps of;
   supplying the phase information to a first transistor;
   supplying the envelope code to a second transistor, wherein the first and second transistors each comprise first and second main electrodes, the first main electrode of one of the first and second transistors being coupled to the second main electrode of the other one of the first and second transistors, and comprising the step of generating an amplitude-modulated signal at the other second main electrode;

supplying an inverse phase information to a further first transistor; and supplying an inverse envelope code to a further second transistor, wherein the further first and further second transistors each comprise first and second main electrodes, the first main electrode of one of the further first and further second transistors being coupled to the second main electrode of the other one of the further first and further second transistors and the other second main electrode being coupled to the output of the modulator.

14. A computer program product embodied on a non-transitory, computer readable medium;

wherein the computer program product includes instructions, when executed by a computer, for performing the steps of the method as defined in claim 13.

* * * * *